(12) United States Patent
Kapoor et al.

(10) Patent No.: US 6,303,995 B1
(45) Date of Patent: Oct. 16, 2001

(54) SIDEWALL STRUCTURE FOR METAL INTERCONNECT AND METHOD OF MAKING SAME

(75) Inventors: Ashok K. Kapoor, Palo Alto; Ratan K. Choudhury, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 744 days.

(21) Appl. No.: 08/586,587

(22) Filed: Jan. 11, 1996

(51) Int. Cl.[7] ............................ H01L 23/48; H01L 23/52; H01L 29/40
(52) U.S. Cl. ............................................. 257/765; 257/771
(58) Field of Search .................................. 257/764, 765, 257/751, 771

(56) References Cited

U.S. PATENT DOCUMENTS 4,980,752 * 12/1990 Jones, Jr. ............................. 257/763
5,498,555 * 3/1996 Lin .
5,605,858 * 2/1997 Nishioka et al. .

FOREIGN PATENT DOCUMENTS

| 53-023562 | 4/1978 | (JP) | ............................. H01L/29/48 |
| 60-124845 | 7/1985 | (JP) | ............................. H01L/21/88 |
| 63-086453 | 4/1988 | (JP) | ............................. H01L/21/88 |

* cited by examiner

*Primary Examiner*—Sheila V. Clark
(74) *Attorney, Agent, or Firm*—John P. Taylor

(57) ABSTRACT

Disclosed is an integrated circuit structure having one or more metal lines thereon with metal line sidewall retention structures formed on the sides of the metal lines. The metal line sidewall retention structures comprise a material sufficiently hard to inhibit lateral distortion or expansion of portions of the metal line during subsequent processing or use of the metal line. The metal line sidewall retention structures are formed by anisotropically etching a layer of a material sufficiently hard to inhibit lateral distortion or expansion of portions of the metal line after formation of a layer of such a material over and around the sides of the metal lines.

3 Claims, 3 Drawing Sheets

SIDEWALL STRUCTURE FOR METAL INTERCONNECT AND METHOD OF MAKING SAME

BACKGROUND OF THE INVENTION

1. Field of the Invention

This invention relates to metal interconnects in integrated circuit structures. More particularly, this invention relates to the formation of retention sidewall structures on the sides of metal interconnects to prevent lateral deformation of the metal interconnect.

2. Description of the Related Art

In the formation of integrated circuit structures, one or more patterned metal layers or "interconnects" are formed between insulation layers, e.g., between silicon oxide layers. Typically, each of such patterned metal layers actually comprises a sandwich of several electrically conductive layers including a main metal layer which usually comprises an aluminum layer or a layer of an aluminum alloy, such as an aluminum/copper (Al—Cu) alloy or an aluminum/copper/silicon (Al—Cu—Si) alloy. This main layer, which is principally selected for its conductivity, is typically sandwiched in between a thin lower layer of titanium and thin upper layers of titanium and titanium nitride. These thin layers are relatively hard, compared to the main layer, and serve to prevent vertical deformation of the aluminum-containing main layer during subsequent processing, especially during thermal processing such as annealing. Thus, for example, the formation of hillocks or volcanos by upward expansion of the main aluminum-containing layer is inhibited.

However, the patterning of such metal and other electrically conductive layers to form the desired metal interconnects or "wiring harness" extends through all of the electrically conductive layers, thereby exposing the sidewalls of the main metal layer. Subsequent exposure to heat, for example, by annealing of the structure can result in undesirable lateral deformation and expansion of the main metal layer.

FIG. 1 shows a typical prior art construction of a patterned multilayer construction just after the patterning step and prior to exposure of the patterned structure to further processing, particularly heat generating processing such as any subsequent annealing. In FIG. 1, an integrated circuit structure 2 comprising a semiconductor wafer, is shown having a first insulation layer 4 formed thereon, such as a silicon oxide layer, and two metal lines 10 and 12 formed over insulation layer 4. Each metal line comprises the patterned portions of: a first titanium layer 16 formed over oxide layer 4; a first titanium nitride layer 18 formed over titanium layer 16; a main metallic layer 20, comprising an aluminum-containing alloy, formed over first titanium nitride layer 18; and a second titanium nitride layer 26 formed over aluminum-containing layer 20. A second oxide layer 30 is shown formed over and between metal lines 10 and 12.

FIG. 2 shows the same structure as FIG. 1, but after subsequent processing of the structure, including exposure to elevated temperature, such as, for example, an annealing step carried out at about 600° C. It will be noted that main aluminum-containing layer 20 has deformed, at least in part due to the stresses formed therein from exposure to heat, causing lateral expansion of main metal layer 20 in each metal line, at 22. Depending upon the spacing between adjacent metal lines, such expansion could eventually result in shorting between adjacent metal lines 10 and 12, or could at least result in undesirable stress in the portions of oxide layer 30 separating adjacent metal lines 10 and 12.

It should also be noted that while the titanium and titanium nitride layers 16, 18, and 26 are hard enough to inhibit vertical distortion caused by stresses in main metal layer 20, the portions of oxide layer 30 in between metal lines 10 and 12 are not sufficiently hard to inhibit stress-induced lateral distortion of metal layer 20 in metal lines 10 and 12. Thus, for example, the oxide spacers sometimes found on the sidewalls of gate electrodes, do not serve to inhibit such stress-induced lateral distortion or expansion, but rather serve merely to provide insulation, or in some instances, temporary masking, e.g., during the formation of LDD regions in the underlying semiconductor substrate adjacent the channel region of an MOS device.

It would, therefore, be desirable to provide a structure which would result in inhibition of the lateral distortion of metal lines or other patterned metal formations in integrated circuit structures.

SUMMARY OF THE INVENTION

The invention comprises an integrated circuit structure having one or more metal lines thereon with metal line sidewall retention structures formed on the sides of metal lines comprising a material sufficiently hard to inhibit lateral distortion or expansion of portions of the metal line during subsequent processing or use of the metal line.

DETAILED DESCRIPTION OF THE INVENTION

The invention comprises an integrated circuit structure having one or more metal lines thereon with metal line sidewall retention structures formed on the sides of the metal lines. The metal line sidewall retention structure comprises a material sufficiently hard to inhibit lateral distortion or expansion of portions of the metal line during subsequent processing or use of the metal line.

Figure 1:
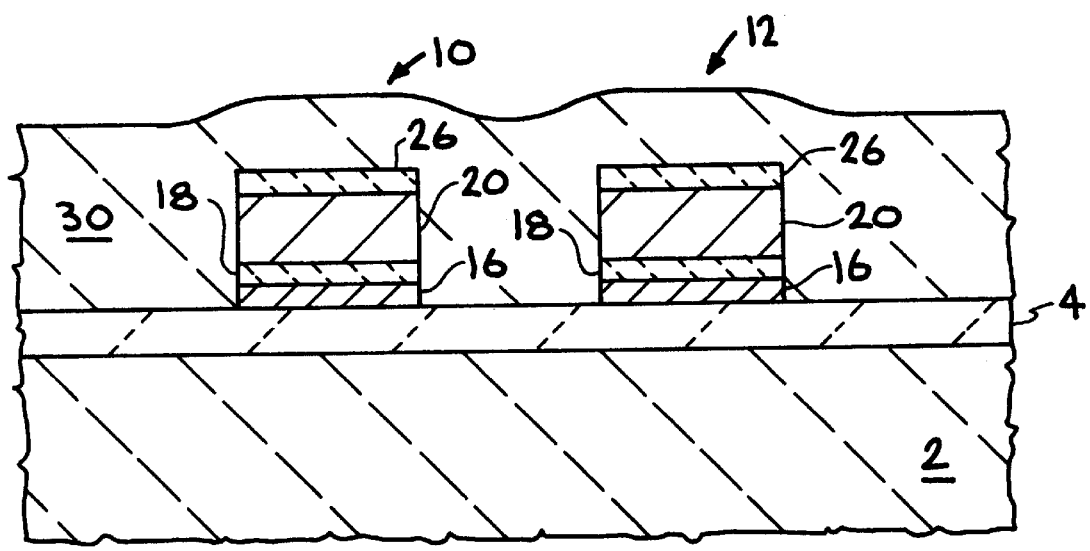
FIG. 1 is a fragmentary vertical side section view of a prior art integrated circuit structure with newly patterned metal lines formed thereon.
Figure 2:
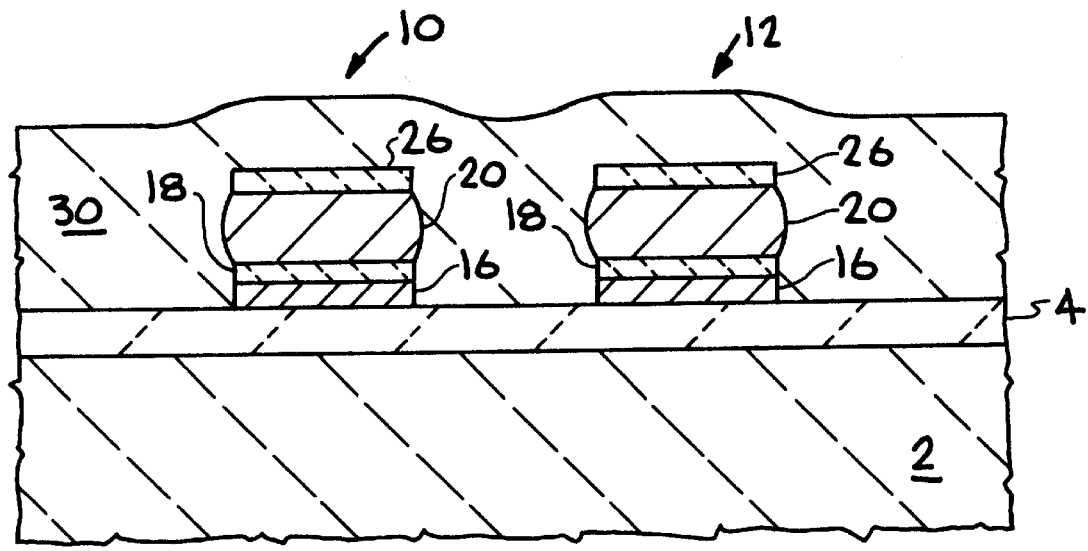
FIG. 2 is a fragmentary vertical side section view of the prior art integrated circuit structure of FIG. 1 after subsequent processing, resulting in lateral distortion of portions of the patterned metal lines formed thereon.
Figure 3:
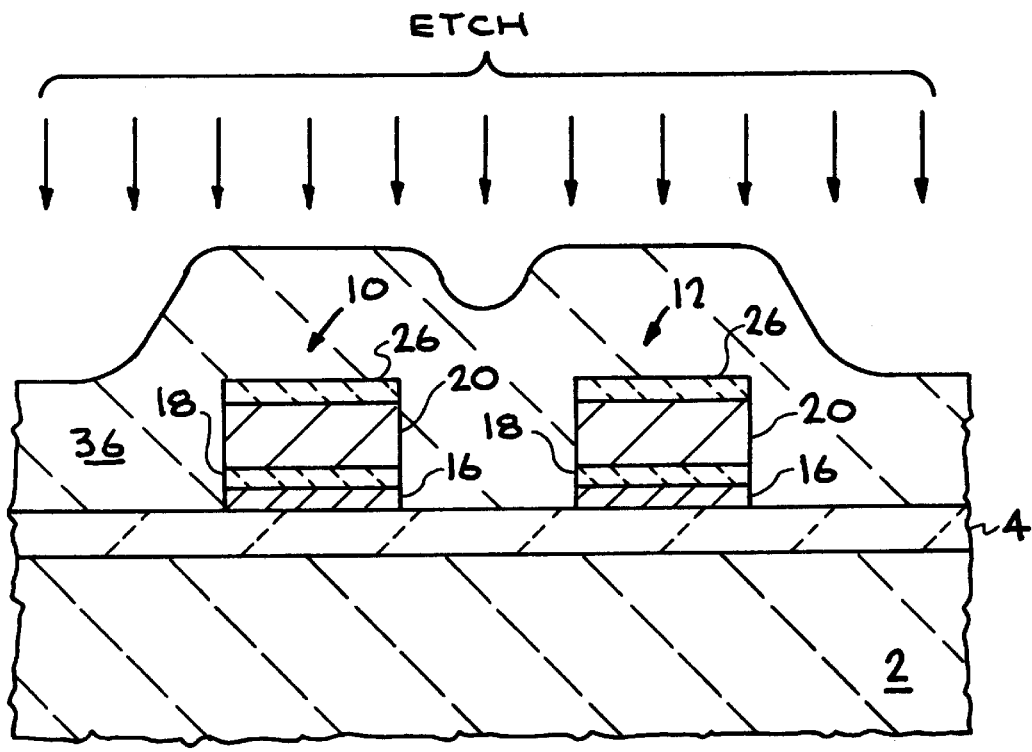
FIG. 3 is a fragmentary vertical side section view of an integrated circuit structure showing a layer of a hard material formed thereon and around the metal lines and being anisotropically etched to form metal line sidewall retention structures on the sides of the metal lines in accordance with the invention.

Turning now to FIG. 3, an integrated circuit structure 2 comprising a semiconductor wafer is shown similar to that shown in FIG. 1. A first insulation layer 4, such a silicon oxide layer, is formed over integrated circuit structure 2, and metal lines 10 and 12 are shown formed over insulation layer 4. As in the previous description, in the illustrated embodiment each metal line comprises a titanium layer 16 formed over oxide layer 4, a first titanium nitride layer 18, a main metallic layer 20, comprising an aluminum-containing alloy, formed over first titanium nitride layer 18, and a second titanium nitride layer 26 formed over aluminum layer 20. However, unlike the structure illustrated in FIG. 1, in accordance with the invention, at this point a layer 36 of a hard material is formed over, and adjacent the sidewalls of, metal lines 10 and 12, and over the exposed portions of first oxide layer 4, as shown in FIG. 3.

Layer 36 must comprise a material capable of retaining the main metal layer 20, i.e., capable of preventing or inhibiting lateral expansion or distortion of metal layer 20. Therefore, layer 36 will comprise a material which is the same or similar to titanium layer 16 or titanium nitride layers 18 and 26, which are used to inhibit vertical movement of metal layer 20. Examples of materials which exhibit sufficient hardness to prevent or inhibit lateral expansion or distortion of metal layer 20 include refractory metals such as titanium, tantalum, niobium, and tungsten; and metal compounds, comprising nitrides, borides, or carbides of such refractory metals. It should be noted, however, that oxides should be avoided, since such materials do not possess sufficient hardness to provide the desired lateral retention of metal layer 20. It should also be noted that metal alloys, including refractory metal alloys, e.g., titanium-tungsten alloys, should be avoided since, for example, the lower melting point of such alloys may inhibit their functioning in the manner intended.

Layer 36 is formed over underlying insulation layer 4 and lines 10 and 12 to a thickness which is preferably equal to or slightly greater than the height of lines 10 and 20 so that the sidewall of metal layer 20 will be completely covered by layer 36. Greater heights or thicknesses of layer 36 can be used, but are unnecessary and will result in the need for extended etching times. The minimum thickness of layer 36 adjacent lines 10 and 12 must be sufficient to cover all of the exposed sidewall of metal layer 20.

In addition, in this embodiment (where a mask is not used over lines 10 and 12), the thickness of layer 36 over lines 10 and 12 should be approximately equal to the thickness of layer 36 over insulation layer 4 (except at the edges of metal lines 10 and 12), so that the etching of layer 36 down to insulation layer 4 will be accomplished in about the same time as the etching of insulation layer 36 down to the top layer of metal lines 10 and 12, to avoid etching top layer 26 of metal lines 10 and 12 (since layer 36 may be made of the same material as layers 16, 18, or 26 of lines 10 and 12).

As shown by the vertical arrows in FIG. 3, layer 36, after formation over metal lines 10 and 12, is then subjected to an anisotropic etch, for example using a reactive ion etch (RIE) using appropriate chemistry for the particular material comprising layer 36. For example, when layer 36 comprises titanium metal, a $Cl_2$—$N_2$ etch system may be used, while a $SF_6$, Ar etch system can be used when layer 36 comprises tungsten metal. For a metal compound, such as titanium nitride, a $Cl_2$—$N_2$ etch system can be used. In any event, preferably the etch system to be used will be selective to the underlying first insulation layer 4, e.g., silicon oxide. That is, preferably the etch system selected should etch the material comprising layer 36 in preference to the underlying first insulation layer so that underlying insulation layer 4 may serve as an etch stop for the etchant system.

Figure 4:
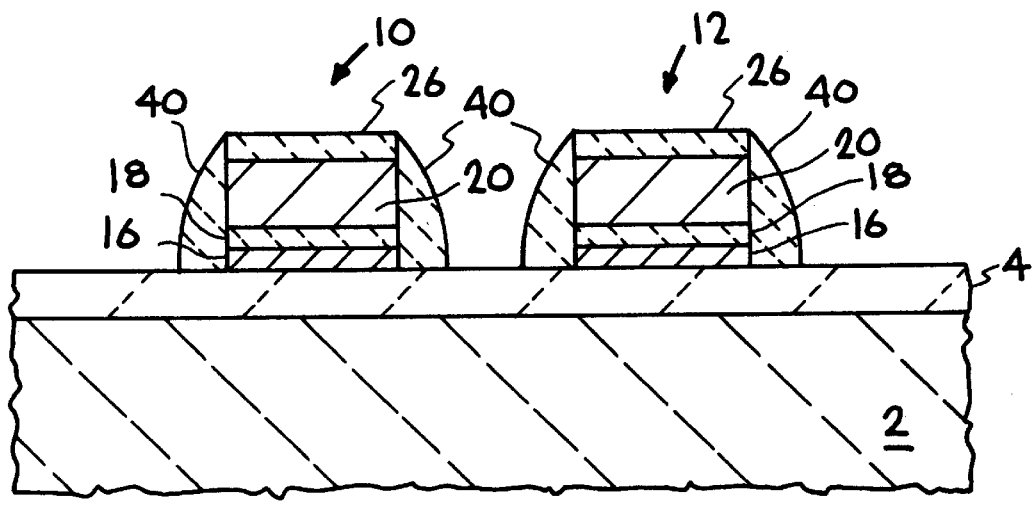
FIG. 4 is a fragmentary vertical side section view of the integrated circuit structure of FIG. 3 after formation of metal line sidewall retention structures on the sides of the patterned metal lines in accordance with the invention.

As is known to those skilled in the art, an anisotropic etch of a non-planar layer will result in the formation of residues or shoulders of the material being etched on the sides of a non-etched material which is not etched, either due to its being a dissimilar material, or being protected by a mask layer, or simply because there is a greater thickness of the raised material. After the etching of layer 36 reaches or exposes underlying insulation layer 4, the etching step is stopped, resulting in the structure shown in FIG. 4, wherein metal line sidewall retention structures 40 are formed on both sidewalls or edges of metal layer 20 of lines 10 and 12.

Figure 5:
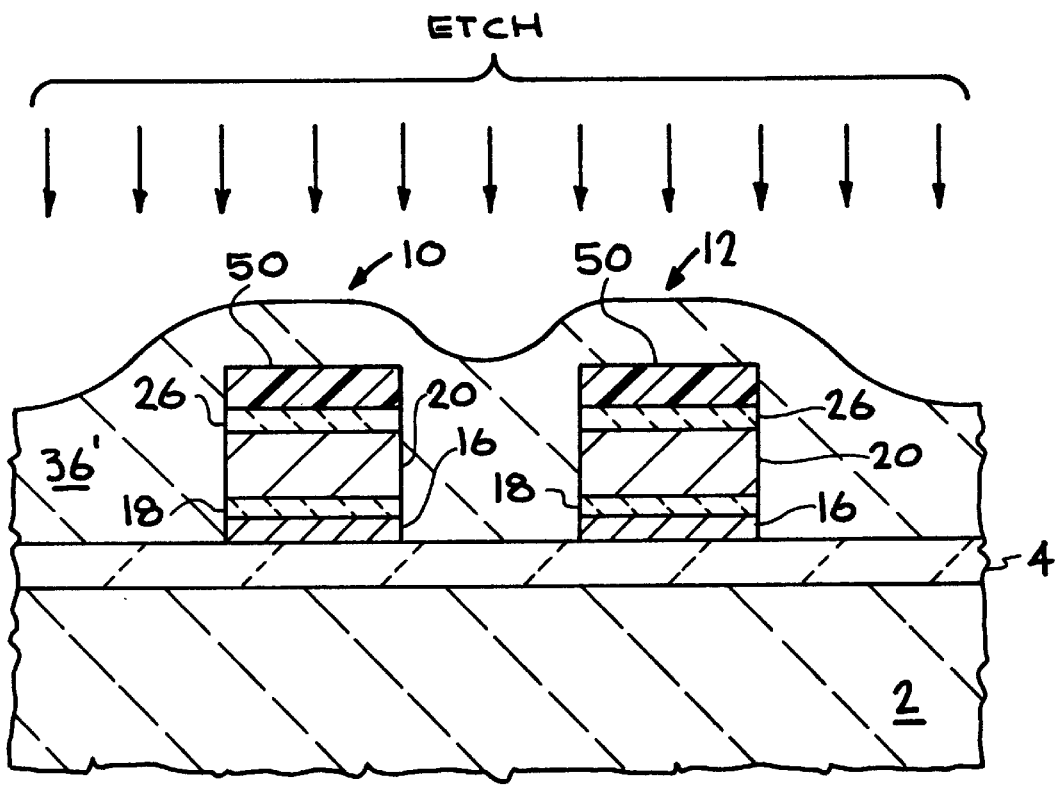
FIG. 5 is a fragmentary vertical side section view of another embodiment of the invention showing a mask formed over the metal lines and a layer of a hard material formed over the mask and around the metal lines, and being anisotropically etched to form the metal line sidewall retention structures of the invention.
Figure 6:
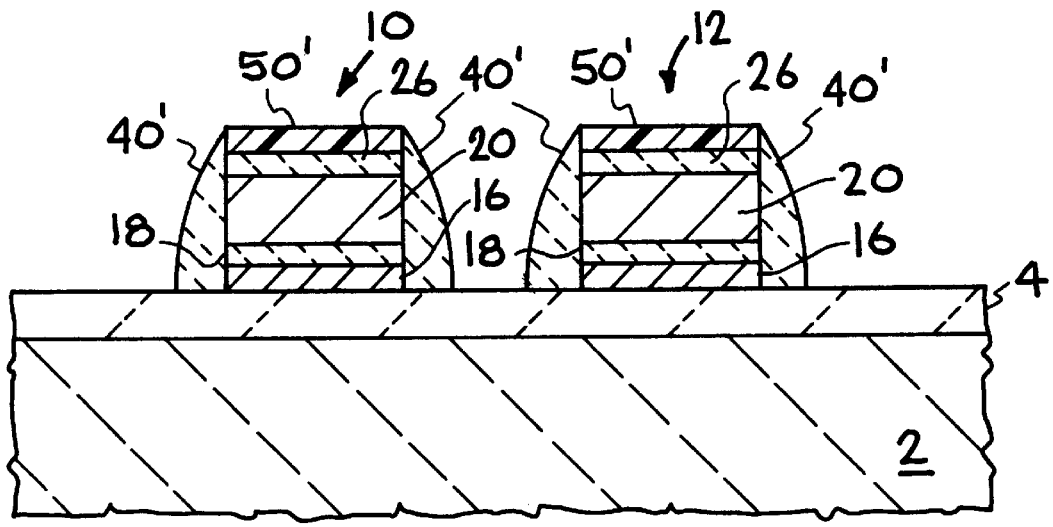
FIG. 6 is a fragmentary vertical side section view of the integrated circuit structure of FIG. 5 after formation of metal line sidewall retention structures on the sides of the patterned metal lines in accordance with the invention.

In another embodiment, as shown in FIGS. 5–6, a mask 50 could be formed over metal lines 10 and 12 as illustrated in FIG. 5, e.g., during the formation of metal lines 10 and 12, to provide an etch stop for the subsequent etching of layer 36', so that layer 36' would not have to be formed to the same thickness over metal lines 10 and 12 as it is over insulation layer 4. Mask 50 could comprise a photoresist material, or an oxide such as silicon oxide, or any other material compatible with the remainder of the integrated circuit structure and which does not etch at the same rate as the material comprising layer 36'.

As shown in FIG. 5, mask 50 will then protect the uppermost layer of metal lines 10 and 12 from being etched, e.g., layer 26, while the etching of the portions of layer 36' over insulation layer 4 continues until layer 4 is exposed. The result, as shown in FIG. 6, would be the formation of metal line sidewall retention structures 40' on the sidewalls of metal lines 10 and 12, although remaining portions 50 ' of mask 50 (portions of mask 50 not removed during the etch step) would then need to be removed. Should elevated peaks or kerfs of metal line sidewall retention structures 40' be thereby exposed by the removal of mask portions 50', such could be easily removed, for example, by a chemical/mechanical polishing step if necessary.

As another alternative, top layer 26 of metal lines 10 and 12 may merely be made thicker during initial formation of top layer 26 to compensate for removal of some of layer 26 during the etching of layer 36 to form metal line sidewall retention structures 40 in accordance with the invention.

Thus, the invention provides for the inhibiting of lateral distortion and deformation of metal portions of metal lines by the provision of metal line sidewall retention structures on the exposed sidewalls of such metal portions, and comprising a material of sufficient hardness to provide the desired protection against such lateral distortion or deformation.

Having thus described the invention what is claimed is:

1. An improved integrated circuit structure wherein at least an aluminum layer portion of metal lines is inhibited from lateral distortion which comprises:
   a) an integrated circuit structure having a surface formed of an insulation material;
   b) one or more metal lines comprising an aluminum layer portion formed over said surface of said insulation material; and
   c) silicon nitride metal line sidewall retention structures formed on the sidewalls of said metal lines to inhibiting lateral distortion of said aluminum layer portion of said metal lines.

2. The integrated circuit structure of claim 1 wherein said metal lines comprise a composite of patterned layers comprising:
   a) a first layer beneath said aluminum-containing layer and comprising a material capable of inhibiting vertical distortion of said aluminum-containing layer of said metal lines;

b) said aluminum-containing layer capable of distortion; and c) an upper layer of a material capable of inhibiting vertical distortion of said aluminum-containing layer of said metal lines;

whereby said aluminum-containing layer capable of distorting is inhibited both laterally and vertically from said distorting.

3. An improved integrated circuit structure wherein an aluminum-containing layer of metal lines is inhibited from lateral distortion which comprises:

a) an integrated structure having a surface formed of a silicon oxide insulation material;

b) one or more metal lines formed over said surface of said insulation material, said metal lines further comprising an aluminum-containing layer capable of lateral distortion; and c) silicon nitride metal line sidewall retention structures capable of inhibiting said lateral distortion of said aluminum-containing layer formed on the sidewalls of said metal lines, said silicon nitride metal line sidewall retention structures formed by anisotropically etching a layer of silicon nitride formed over said metal lines and said surface of said insulation material.

* * * * *